United States Patent
Gajic et al.

(10) Patent No.: US 8,912,801 B2
(45) Date of Patent: Dec. 16, 2014

(54) METHOD AND ARRANGEMENT FOR AN INTERNAL FAILURE DETECTION IN A Y-Y CONNECTED CAPACITOR BANK

(71) Applicants: Zoran Gajic, Vasteras (SE); Mustafa Ibrahim, Vasteras (SE); Jianping Wang, Vasteras (SE)

(72) Inventors: Zoran Gajic, Vasteras (SE); Mustafa Ibrahim, Vasteras (SE); Jianping Wang, Vasteras (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 13/966,940

(22) Filed: Aug. 14, 2013

(65) Prior Publication Data

US 2013/0328569 A1 Dec. 12, 2013

Related U.S. Application Data

(63) Continuation of application No. PCT/EP2011/052290, filed on Feb. 16, 2011.

(51) Int. Cl.
| | |
|---|---|
| *G01R 31/08* | (2006.01) |
| *G01R 31/42* | (2006.01) |
| *G01R 31/40* | (2014.01) |
| *H02H 7/16* | (2006.01) |
| *G01R 31/02* | (2006.01) |
| *G05F 1/70* | (2006.01) |
| *H02J 3/18* | (2006.01) |

(52) U.S. Cl.
CPC .............. *G01R 31/40* (2013.01); *G01R 31/02* (2013.01); *G01R 31/42* (2013.01); *H02H 7/16* (2013.01); *G05F 1/70* (2013.01); *H02J 3/1828* (2013.01)
USPC ........... 324/521; 324/519; 324/512; 323/209; 323/210

(58) Field of Classification Search
CPC ........ G01R 31/02; G01R 31/42; G01R 31/40; H02H 7/16; G05F 1/70; H02J 3/1828
USPC ................... 324/521, 519, 512; 323/209–210
See application file for complete search history.

(56) References Cited

U.S. PATENT DOCUMENTS

| | | | | |
|---|---|---|---|---|
| 2,349,611 A | * | 5/1944 | Butler | 361/17 |
| 2,376,201 A | * | 5/1945 | Starr | 361/17 |

(Continued)

FOREIGN PATENT DOCUMENTS

| | | |
|---|---|---|
| EP | 0040766 A1 | 12/1981 |
| WO | 2011031684 A1 | 3/2011 |

OTHER PUBLICATIONS

Thalassinakis et al., "Reliable Installation of Alternative Capacitor Banks Against Reactive Power Shortage", 2003 IEEE Bologna PowerTech Conference, Jun. 2003, p. 1-8.*

(Continued)

*Primary Examiner* — Patrick Assouad
*Assistant Examiner* — Lamarr Brown
(74) *Attorney, Agent, or Firm* — St. Onge Steward Johnston & Reens LLC

(57) ABSTRACT

A method for detecting an internal failure in a capacitor bank connected to a power system, wherein the capacitor bank includes a plurality of capacitor units that are divided into two Y sections. Each phase in each of the Y sections defines a leg and each leg includes series and/or parallel-connected capacitor units. The internal failure may occur in one or more capacitor elements or units or involve one or more legs. The method includes measuring the phase current in one of the phases, calculating the root mean square value, denoted by RMS, of the measured phase currents, measuring the unbalanced current between the two sections, calculating the RMS value of the measured unbalanced currents, and detecting the phase angle between the measured phase current and the measured unbalanced current.

9 Claims, 9 Drawing Sheets

(56) References Cited

U.S. PATENT DOCUMENTS

| | | | |
|---|---|---|---|
| 2,794,154 A * | 5/1957 | Minder et al. | 361/17 |
| 2,799,807 A * | 7/1957 | Schultz et al. | 361/17 |
| 2,810,865 A * | 10/1957 | Minder | 361/17 |
| 2,888,613 A * | 5/1959 | Cuttino | 361/17 |
| 2,918,588 A * | 12/1959 | Luehring et al. | 307/328 |
| 2,942,153 A * | 6/1960 | Schultze et al. | 361/17 |
| 3,123,741 A * | 3/1964 | Lemens | 361/17 |
| 3,158,783 A * | 11/1964 | Minder | 361/17 |
| 3,254,270 A * | 5/1966 | Aungst | 361/830 |
| 3,255,382 A * | 6/1966 | Wolf | 361/16 |
| 3,270,246 A * | 8/1966 | Lemens | 361/17 |
| 3,348,097 A * | 10/1967 | Lemens | 361/17 |
| 3,401,305 A * | 9/1968 | Lemens | 361/17 |
| 3,909,672 A * | 9/1975 | Lundquist et al. | 361/17 |
| 4,104,687 A * | 8/1978 | Zulaski | 361/17 |
| 5,293,110 A * | 3/1994 | Andrei | 323/209 |
| 6,465,979 B1 * | 10/2002 | Leijon et al. | 318/438 |
| 7,667,353 B2 * | 2/2010 | Coolidge et al. | 307/127 |
| 8,569,909 B2 * | 10/2013 | Thorburn et al. | 307/14 |
| 8,643,383 B2 * | 2/2014 | Xiao et al. | 324/548 |
| 2008/0010549 A1 * | 1/2008 | Coolidge et al. | 714/44 |
| 2011/0057661 A1 * | 3/2011 | Samineni et al. | 324/521 |
| 2012/0112559 A1 * | 5/2012 | Thorburn et al. | 307/115 |
| 2012/0194202 A1 * | 8/2012 | Xiao et al. | 324/548 |
| 2012/0249092 A1 * | 10/2012 | Krok et al. | 323/209 |
| 2013/0128393 A1 * | 5/2013 | Gajic | 361/15 |
| 2013/0338946 A1 * | 12/2013 | Gajic et al. | 702/58 |

OTHER PUBLICATIONS

Samineni et al., "Fault Location in Shunt Capacitor Banks", Developments in Power System Protection (DPSP 2010), Mar. 29-Apr. 1, 2010, p. 1-4.*

Lim et al., "Improvement of the Voltage Difference Method to Detect Arcing Faults Within Unfused Ground-Wye 22.9-kV Shunt Capacitor Bank", IEEE Transactions on Power Delivery, vol. 22, No. 1, Jan. 2007.*

Liang Ma et al., "Analyse on Relay Maloperation of Assembling Capacitor Bank for Internal Fault Protection", Power and Energy Engineering Conference (APPEEC), Mar. 2010, p. 1-4.*

Hendrickson et al., "Abnormal Voltage Conditions Produced by Open Conductors on 3-Phase Circuits Using Shunt Capacitors", Power Apparatus and Systems, Jan. 1953, p. 1183-1193.*

Kalyuzhny et al., "Considerations of Neutral Current Protection Operation During Cascade Short-Circuit of Capacitor Unit", Electrical and Electronics Engineers in Israel, Mar. 1995, p. 1-5.*

Compton; "Balancing Double-Wye High-Voltage Capacitor Banks"; IEEE Transactions on Power Apparatus and Systems; Aug. 1955; pp. 573-580.

International Preliminary Report on Patentability Application No. PCT/EP2011/052290 Completed: Jan. 29, 2013 29 pages.

International Search Report & Written Opinion of the International Searching Authority Application No. PCT/EP2011/052290 Completed: Nov. 4, 2011; Mailing Date: Nov. 15, 2011 12 pages.

Samineni, et al.; "Principles of Shunt Capacitor Bank Application and Protection"; IEEE 2010; 14 pages.

* cited by examiner

| Failure event | Instant of failure event (sec) | Unbalance current $I_{un}$ (p.u.) | Unbalance current phase angle $\Theta_{I_{un},I_{phA}}$ (degrees) | Unbalance current step change $I_{ch}$ (p.u.) | Current step change phase angle $\varphi_{ch}$ (degrees) | Number of failed elements | Fault location |
|---|---|---|---|---|---|---|---|
| 1 | 1.15 | 0.0005 | 240.14 | 0.0005 | 60.14 | 2 | B2 |
| 2 | 1.20 | 0.0008 | 240.15 | 0.0003 | 60.18 | 1 | B2 |
| 3 | 1.25 | 0.0011 | 240.17 | 0.0003 | 60.20 | 1 | B2 |
| 4 | 1.30 | 0.001 | 252.29 | 0.0002 | 179.90 | 1 | A2 |
| 5 | 1.40 | 0.0022 | 280.46 | 0.0014 | 119.73 | 5 | C1 |
| 6 | 1.50 | 0.0021 | 284.89 | 0.0002 | -120.19 | 1 | B1 |
| 7 | 1.70 | 0.0018 | 282.90 | 0.0002 | - 60.11 | 1 | C2 |
| 8 | 1.79 | 0.0016 | 280.11 | 0.0003 | - 60.16 | 1 | C2 |
| 9 | 1.87 | 0.0011 | 349.54 | 0.0016 | -119.95 | 5 | B1 |
| 10 | 1.95 | 0.002 | 271.17 | 0.0021 | 60.21 | 5 | B2 |
| 11 | 2.10 | 0.0015 | 259.96 | 0.0006 | -59.90 | 2 | C2 |

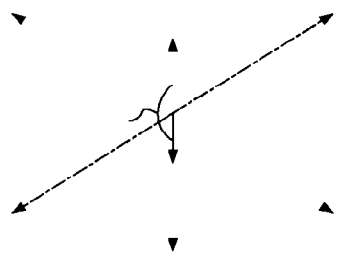
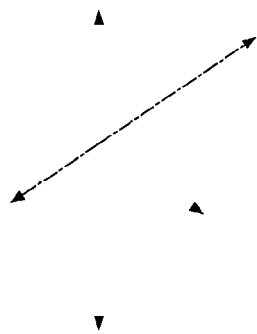
Fig. 5a
Fig. 5b
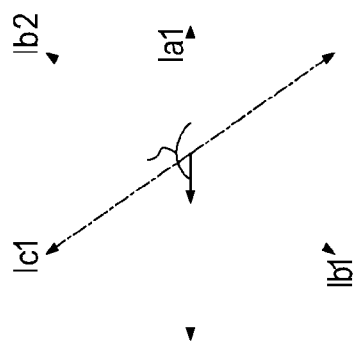

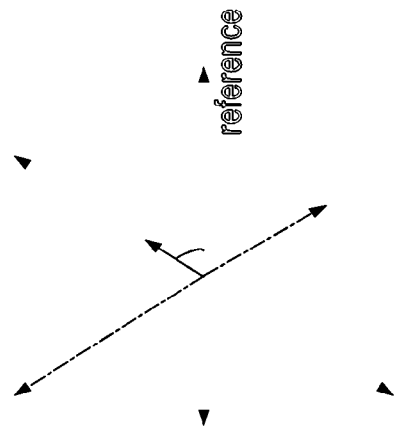
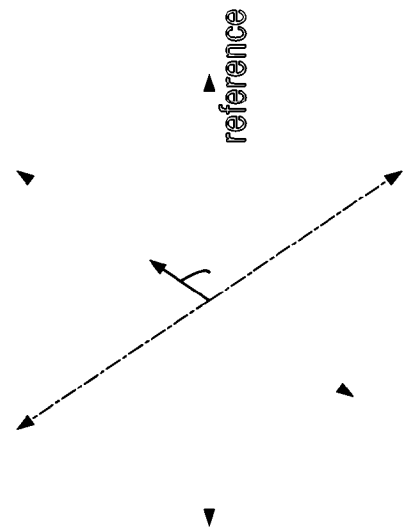
Fig. 5c

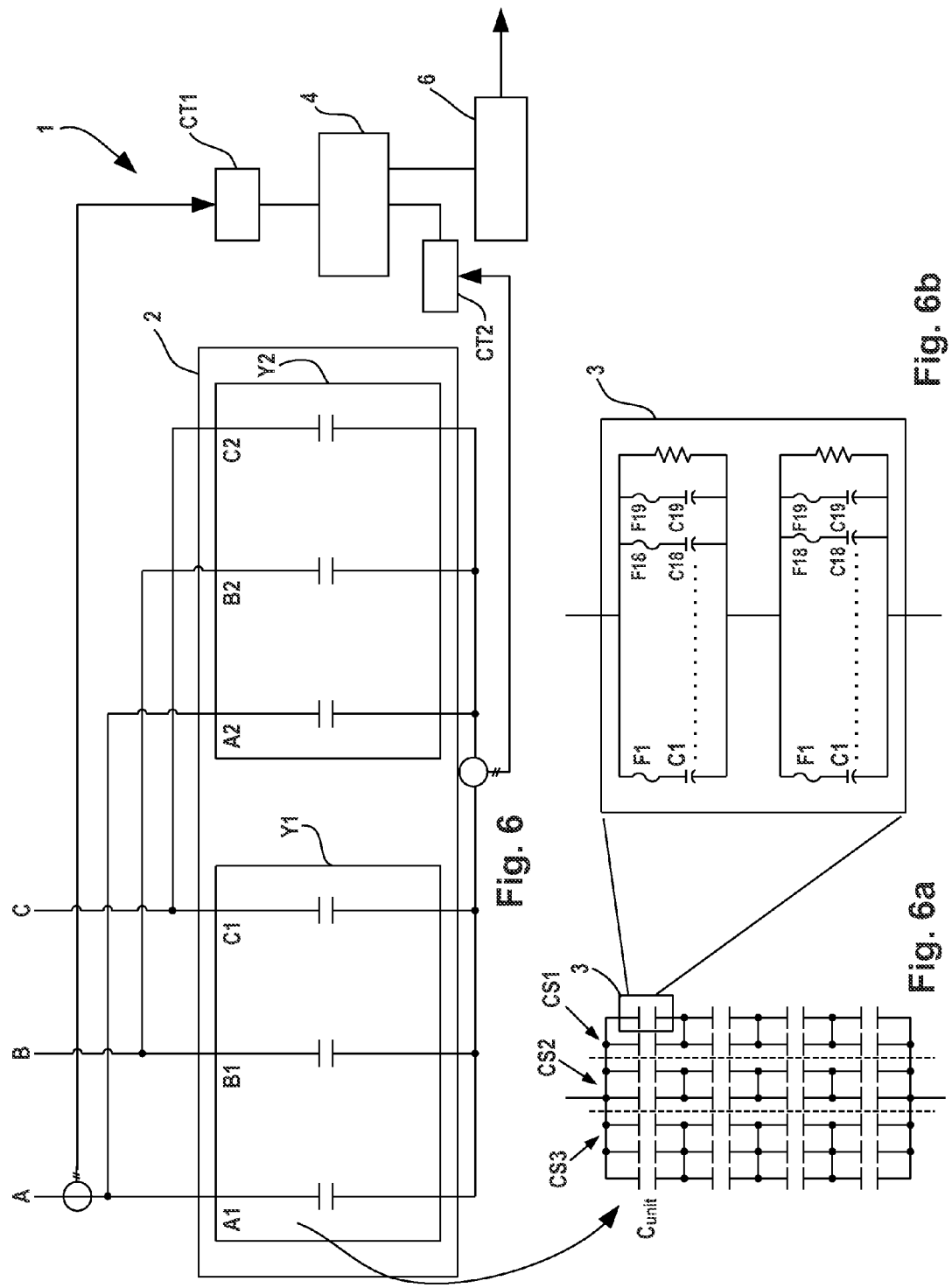

| Blown fuses | Unbalance current between wyes, per unit phase A current |
|---|---|
| f | In |
| 0 | 0.00000% |
| 1 | 0.04876% |
| 2 | 0.10135% |
| 3 | 0.15823% |
| 4 | 0.21994% |
| 5 | 0.28714% |
| 6 | 0.36058% |
| 7 | 0.44118% |
| 8 | 0.53004% |
| 9 | 0.62849% |
| 10 | 0.73819% |
| 11 | 0.86117% |
| 12 | 1.00000% |
| 13 | 1.15796% |
| 14 | 1.33929% |
| 15 | 1.54959% |
| 16 | 1.79641% |
| 17 | 2.09016% |
| 18 | 2.44565% |
| 19 | 2.88462% |

Fig.7

METHOD AND ARRANGEMENT FOR AN INTERNAL FAILURE DETECTION IN A Y-Y CONNECTED CAPACITOR BANK

FIELD OF THE INVENTION

The present invention relates to the field of detecting an internal failure in a capacitor bank connected to a power system. It relates in particular to detecting an internal failure in a Y-Y connected capacitor bank. The capacitor bank is further divided into two Y-connected sections. Each of the Y sections is, at one end, connected to each individual phase of the multi-phase power system and, at the other end, Y-connected to form a neutral point. Therefore, a leg including series and parallel connected capacitor units is formed for each of the phases. This means that for a three-phase system, each of the Y sections has three legs. Furthermore, each of the capacitor units comprises a plurality of capacitor elements connected in parallel and/or series. The internal failure may be in one or more capacitor elements or units and involves one or more legs in the capacitor bank.

BACKGROUND OF THE INVENTION

Capacitor banks are installed to improve the quality of an electrical supply by providing reactive power compensation and power factor correction in a power system. The use of capacitor banks has increased because they are relatively inexpensive, easy and quick to install, and can be deployed almost anywhere in a power system grid. Capacitor bank installations have other beneficial effects on the system such as improvement of the voltage profile, better voltage regulation, reduction of losses, and reduction or postponement of investments in the transmission and generation capacity.

A capacitor bank is assembled by a plurality of individual capacitor units. Each individual capacitor unit is a basic building block of the capacitor bank and includes a plurality of individual capacitor elements, arranged in parallel/series connected groups, within a metal enclosure. The units can be externally or internally fused, fuseless or unfused depending on the application of the bank. The elements can be connected to fuses and a group of elements is normally shunted by an internal discharge resistor in order to reduce the unit residual voltage after being disconnected from the power system. Each of the capacitor elements is constructed by winding two electrodes of aluminum foil separated by several layers of paper, or plastic film-insulated or a mixed dielectric of paper and plastic film.

Capacitor banks are normally further constructed using individual capacitor units connected in series and/or parallel to obtain a required voltage rating.

However, an internal failure in terms of operated fuses, failed elements and/or failed units in one or more quadrants may occur due to, for example the improper selection of the designed voltage rating that may result in continuous high voltage stress for the selected capacitor bank and eventually may lead to a dielectric failure of capacitor elements. Other causes for internal failure can be overcurrent, overvoltage, short-circuit, thermal failure and internal stress. It may also include incorrect operation of fuses due to bad fuse coordination.

Existing unbalanced protection schemes are typically available to detect such an internal failure. For example, unbalance protection can be utilized in a variety of capacitor bank connections: grounded Y, ungrounded Y, delta, and single-phase. For example, a Y-Y arrangement is a preferable configuration for unbalanced protection of a large capacitor bank that is split into two Y sections. This scheme is based on a current measurement, for example, a current transformer, arranged between the two neutrals. Any change in the capacitance of any capacitor will cause a change in the current measurement.

However, the existing unbalanced protections based on a double Y scheme are liable to detect the number of element and/or unit failures incorrectly. For example, in a three-phase capacitor bank, an internal failure in one leg may cancel the unbalanced signal produced by another internal failure in another leg sharing the same phase but in the other section of the bank, while failures involving three legs in the same Y section may results in no unbalanced signal. Consequently, neither alarm nor trip signal would be sent when it should be sent. Undetected failures inside a capacitor bank may lead to a risk of fire or explosion accompanied by severe damage to the whole capacitor bank before taking early preventive action.

Furthermore, failures in two phases of one Y section may be seen as a failure in the third phase of the other Y section, which may result in an over-accumulation effect as if there is already a failure in this third phase. This over-accumulation effect may further result in a false alarm or trip signal.

In "Principles of shunt capacitor bank application and protection", by SATISH SAMINENI ET AL published in PROTECTIVE RELAY ENGINEERS, 2010 63RD ANNUAL CONFERENCE FOR, IEEE, PISCATAWAY, N.J., USA, 29 Mar. 2010 (2010-03-29), pages 1-14, XP03f679144, ISBN: 978-1-4244-6073-1.(D1) some methods of fault detection of capacitor banks are disclosed.

D1 especially describes a method for detecting a fault in an ungrounded "double wye" capacitor bank. D1 discusses determining the phase of the capacitor bank where a fault occurs and the number of faulty units in the phase. The method of D1 uses a positive sequence current as a reference for identifying in which phase a fault occurs. The angle of the measured unbalance current of the neutral interconnection between the two parallel "WYEs" are determined in relation to the symmetrical positive sequence current. 0 degrees indicates a fault in phase A, 60 degrees indicates phase B, 120 degrees phase C, 180 degrees phase A, 240 degrees phase B and 300 degrees indicates phase C. However, after a first fault has occurred, the currents will no longer be symmetrical, and the method does not discuss how to find subsequent faults following the first fault. The method of D1 is limited to finding the faulty phase of one fault event and leaves no clue how to identify subsequent faults.

Therefore, a more sensitive and accurate internal failure detection and protection scheme is highly desired.

SUMMARY OF THE INVENTION

One object of the present invention is to provide an improved method for detecting an internal failure in a double Y-connected capacitor bank with better reliability and sensitivity.

This object is achieved by an unbalanced current detection method, characterized in that the method further comprises calculating the per unit value of the unbalanced current based on the calculated RMS value of the measured phase current and the calculated RMS value of the measured unbalanced current, tracking and detecting a change of the unbalanced current between the present calculated per unit value of the unbalanced current and the previous calculated per unit value of the unbalanced current, determining the vectorial step change of the unbalanced current, normalizing the phase angle of the determined vectorial step change to be one of 0°, 60°, 120°, 180°, 240° and 300°, identifying the number of internal failures and their corresponding locations based on the determined vectorial step change of the unbalanced current and the normalized phase angle, and initiating an alarm or a trip signal when the determined total number of internal failures exceeds a first or a second threshold value respectively.

When a failure occurs in the capacitor bank, it will result in a change of the unbalanced current. This failure may involve one or more internal failures in terms of operated fuses, failed elements and/or failed units in one or more legs. The failure can be distinguished by detecting an unbalanced current peak occurrence as a failure event, which occurred during the arcing over the defective capacitor. However, when two internal failures involve two legs sharing the same phase, the unbalanced signals corresponding to these failures may cancel each other. Moreover, failures involving three legs in the same Y section in a three-phase capacitor bank may result in no unbalance signal detected. Furthermore, failures in two phases of one Y section may be seen as a failure in the third phase of another Y section, which may result in an over-accumulation effect as if there is already a failure in this third phase. This over-accumulation effect may further result in a false alarm or trip signal.

According to the invention, such a cancellation or over-accumulation effect is prevented by determining the exact number of the internal failures based on the information of the determined vectorial step change of the unbalanced current and the phase angle between the phase current and unbalanced current. Therefore, the invention makes it possible to determine the exact number of internal failures.

Because the invention makes it possible to determine the exact number of internal failures, the invention makes it possible for the system to perform the correct action by sending the proper alarm and/or trip signal based on accurate information, which increases the sensitivity and reliability of an unbalanced Y-Y protection scheme and solution.

Furthermore, based on the normalized phase angle of the determined vectorial step change of the unbalanced current, the location of an internal failure is identified. It is advantageous that the location of the internal failures is identified in a more clear way, because this consequently makes maintenance of the capacitor bank more efficient. The location is identified at the leg that has experienced the failure event.

A further advantage of the invention is that a scheduled maintenance can be avoided in case that there is no internal failures detected or the number of internal failures per phase is less than a certain limit.

It is advantageous to use a per unit value of the unbalanced current because it is independent of system transients and less dependent of the temperature and frequency variation of the capacitor bank. Therefore, there is no need to compensate the unbalanced signal due to such variations or to consider delay time to avoid transients. This per unit value may be further scaled to a pre-defined value so that the number of internal failures corresponding to this particular unbalanced current can be determined.

Yet another advantage of the invention is that it is not needed to compensate the natural unbalanced current in order to obtain an accurate unbalanced signal. This is because the detection is based on the vectorial step change of the unbalanced current.

According to one embodiment of the invention, the vectorial step change of the unbalanced current is determined by calculating the difference between two measured unbalanced currents, including both magnitude and angle, and tracking the change of the unbalanced current. This may be done by initiating the tracking of the change of the unbalanced current after a short delay to avoid the effect of the abrupt change during arcing followed by a decay of the unbalanced current and ending the tracking when the unbalanced current reaches its marginal steady state.

According to one embodiment of the invention, the alarm signal is determined when the number of the internal failures in any of the legs of the capacitor bank exceeds the first threshold.

According to one embodiment of the invention, the trip signal is determined when the number of the internal failures in one of the legs exceeds the second threshold.

According to one embodiment of the invention, the first and second threshold values correspond to an alarm and trip levels respectively. The alarm level is equivalent to the number of faulted elements, units or the number of operated fuses depending on if the configuration in any of the legs exceeds a predefined overvoltage limit across the healthy ones, this limit may be set above the natural errors to operate reliably after internal failures. The trip level is the maximum number of faulted elements, operated fuses or shorted units depending on the configuration that results in an extra voltage on the healthy capacitors, which does not exceed the contingency overvoltage capability of these capacitors. However, new threshold values may be also introduced.

The object of the invention is also achieved by an arrangement for detecting a number of internal failures in a capacitor bank. Such an arrangement comprises a first current transformer, a second transformer, a computing unit and a protective unit. The first transformer is arranged to measure the phase current in one of the phases. The second current transformer is arranged at the neutral points of the two Y-sections for measuring an unbalanced current. The computing unit is configured to calculate the root mean square value, denoted by RMS, of the measured phase current, calculate the RMS value of the measured unbalanced current, calculating a per unit value of the unbalance current based on the calculated RMS value of the measured phase current and the calculated RMS value of the measured unbalanced current, and calculating the phase angle between the measured phase current and the measured unbalanced current. The protective unit is configured to detect the phase angle between the measured phase current and its corresponding measured unbalanced current, track and detect a change of unbalanced current between the present calculated per unit value of the unbalanced current and the previous calculated per unit value of the unbalanced current, determine the vectorial step change of the unbalanced current, normalize the phase angle of the determined vectorial step change to be one of 0°, 60°, 120°, 180°, 240° and 300°, identify the number of internal failures and their corresponding locations based on the determined vectorial step change of the unbalanced current and the normalized phase angle, and initiate an alarm or a trip signal if the determined number of internal failures exceeds a first or a second threshold value.

According to an embodiment of the invention, the present method may be implemented by a computer program product.

Such a computer program product comprises receiving measured phase currents, calculating the RMS values of the measured phase currents, receiving measured unbalanced currents between the two Y sections, calculating the RMS values of the measured unbalanced currents, calculating the phase angle between the measured phase current and the measured unbalanced current, calculating a per unit value of the unbalanced current based on the calculated RMS value of the measured phase current and the calculated RMS value of the measured unbalanced current, tracking and detecting a change of the unbalanced current between the present calculated per unit value of the unbalance current and the previous calculated per unit value of the unbalanced current, determining the vectorial step change of the unbalanced current, normalizing the phase angle of the determined vectorial step change to be one of 0°, 60°, 120°, 180°, 240° and 300°, determining the number of internal failures and their corresponding locations based on the determined vectorial step change of the unbalanced current and the normalized phase angle, and initiating an alarm or a trip signal when the determined total number of internal elements failures exceeds a first or a second threshold value.

Such a computer program can be loaded from a readable medium into the memory of a computing processor, for example, the computing processor of an electrical device to provide this improved unbalanced current protection for a double Y connected capacitor bank.

BRIEF DESCRIPTION OF THE DRAWINGS

The invention is now explained more closely by the description of different embodiments of the invention and with reference to the accompanying drawings in which:

FIGS. 3a-b show the number of internal failures in both of Y sections corresponding to the instantaneous failure events shown in FIG. 2a.

FIGS. 5a-c illustrate three scenarios, in each of which, an ambiguous detection may appear.

FIG. 6 illustrates schematically an arrangement for detecting an internal failure in a capacitor bank where the capacitor bank is connected to a three-phase system and includes a double Y protection scheme, according to an embodiment of the invention.

FIGS. 6a-b illustrate respectively an example of a schematic configuration of the capacitor units in each of the legs and a schematic configuration of capacitor elements in each of capacitor units of the capacitor bank shown in FIG. 6.

FIG. 7 shows an example of a look up table listing the number of internal failures corresponding to the step change of the per unit value of the unbalanced current based on the arrangement shown in FIGS. 6a-b.

DETAILED DESCRIPTION OF THE INVENTION

Figure 1:
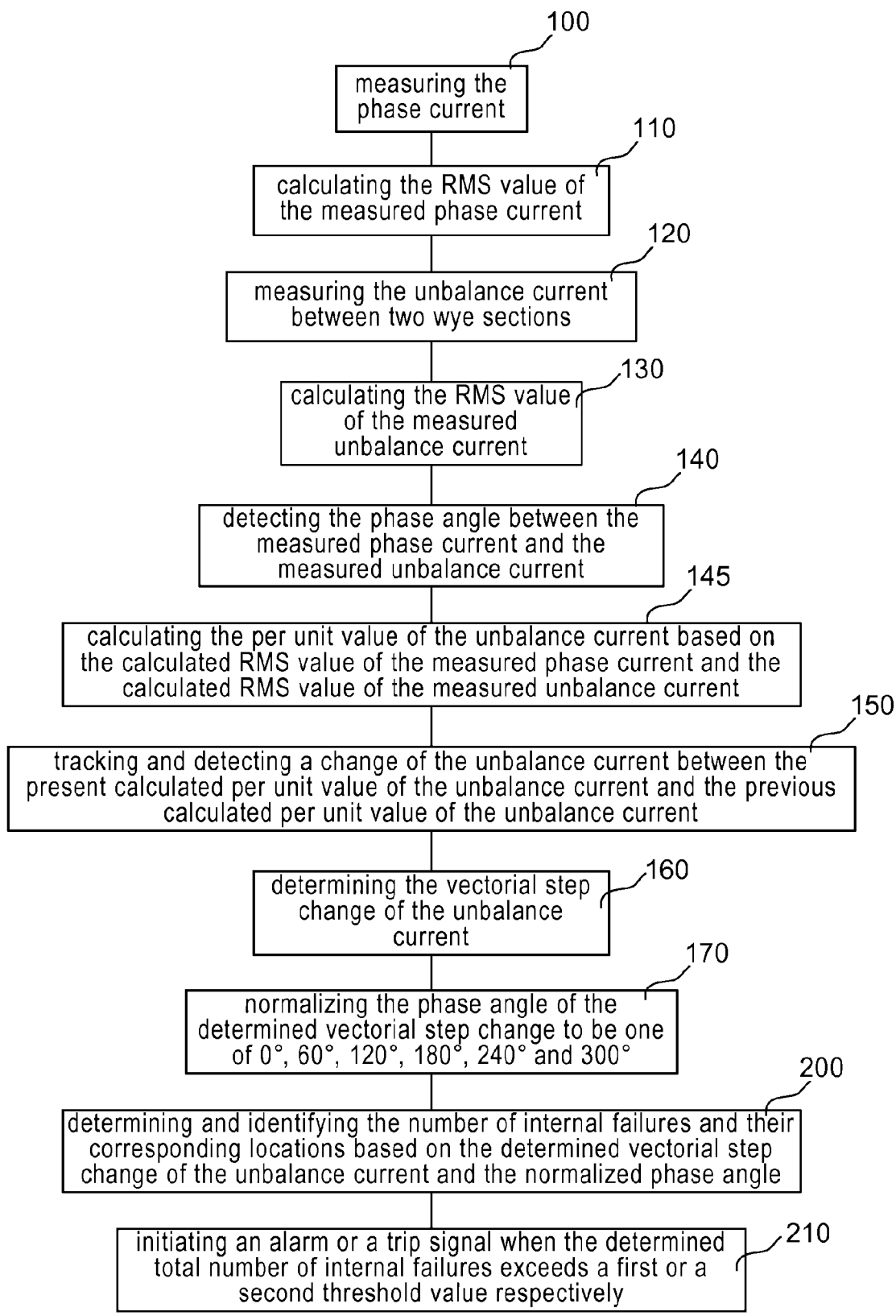
FIG. 1 is a flow chart illustration of the invented method for detecting an internal failure in a Y-Y connected capacitor bank, according to one embodiment of the invention.

With reference to FIG. 6 and FIG. 1, an arrangement 1 for detecting an internal failure of a capacitor bank 2 comprises a first current transformer CT1, a second current transformer CT2, a computing unit 4 and a protective unit 6. The capacitor bank 2 is connected to an electrical power system having three-phase A, B, C and includes two Y connected sections Y1 and Y2, each section Y1/Y2 including three legs A1, B1, C1/A2, B2, C2. Each of the legs is, at one end, connected to its corresponding phase and is at the other end star connected to the neutral of the capacitor bank. The first current transformer CT1 is arranged in one of the phases, in this example in phase A, for measuring the phase current at step 100. The second current transformer is arranged between the neutral points of the two Y sections for measuring the unbalanced current between the sections at step 120.

In this example, each leg has 28 capacitor units 3 distributed over three Strings (CS1, CS2, CS3), wherein the first Cs1 and the second CS2 string has respectively four series groups of two parallel connected capacitor units, while the third CS3 string has four series groups of three parallel connected capacitor units as shown in FIG. 6a. Each capacitor unit has two series groups of 19 parallel-connected capacitor elements (C1 . . . C18, C19) as shown in FIG. 6b. However, it should be understood that the invention is not limited to this specific configuration.

It should be understood that the invention is applicable to any type of fused, fuseless or unfused capacitor banks. In this particular example, the capacitor bank has an internal fused configuration (F1 . . . F18, F19). Furthermore, it should be understood that the invention is applicable to any of multi-phase power systems, wherein the capacitor bank has Y-Y arrangement.

The computing unit 4 is connected to the first current transformer CT1 and second current transformers CT2. The computing unit 4 is configured to receive the measurements from the current transformers and to calculate respectively the RMS values of the measured phase current and unbalanced current at steps 110 and 130. All measurements are based on sampling the instantaneous currents. The samples may be kept in a buffer in a memory for providing a moving snapshot of the input signal and applying recursive RMS current calculations.

Furthermore, the unbalance current per unit $I_{unpa}$ can be calculated based on the ratio between the calculated RMS value of the measured unbalance current $I_{unrms}$ and the calculated RMS value of the phase current $I_{phma}$ as follows in step 145, $$I_{unpu} = \frac{I_{unrms}}{I_{phrms}}$$

Additionally, this per unit value may be further scaled to a pre-specified value contained in a look-up table, see FIG. 7 as an example, wherein, for each of unbalanced current values, the number of internal failures corresponding to this value is provided. In this example, the number of internal failures is presented as the number of blown fuses or failed elements.

The protective unit 6 is configured to communicate with the computing unit 4 and its main function is to determine the number of internal failures and the location of these failures and to send an alarm signal and/or a trip signal based on the number of the internal failures. The alarm or trip signals may be sent to an operator's supervision display in an automation substation and the trip signal may be sent further to a circuit breaker in order to disconnect the electrical connection to the power system. In this embodiment, the computing unit 4 and the protective unit 6 are configured as two separate modules. However, they can be integrated as one unit as intelligent electronic device (IED). The computing unit 4 and the protective unit 6 can be for example a micro-computing processor, a digital signal processor, a field-programmable gate array, or a standard computer.

Based on the calculated RMS values of the measured phase current and the measured unbalanced current, the protective unit is further configured to detect the phase angle at step 140.

Figure 2A:
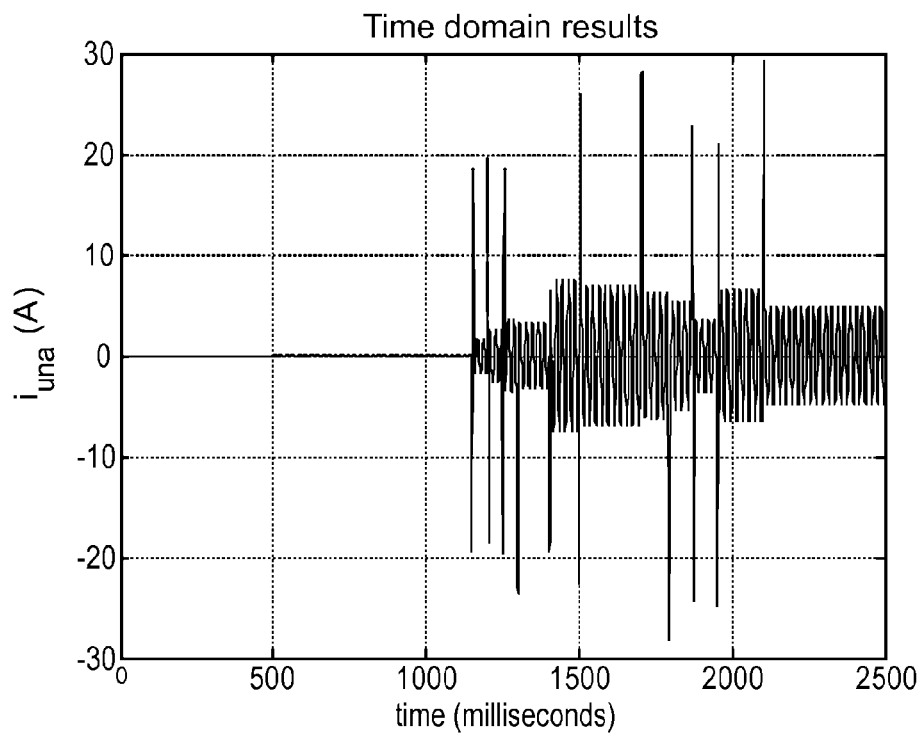
FIGS. 2a-c illustrate respectively an instantaneous unbalanced current waveform, the corresponding unbalanced current per unit and the phase angle between the unbalanced current and the phase current in a simulation test in an example where eleven failure events are detected.
Figure 2B:
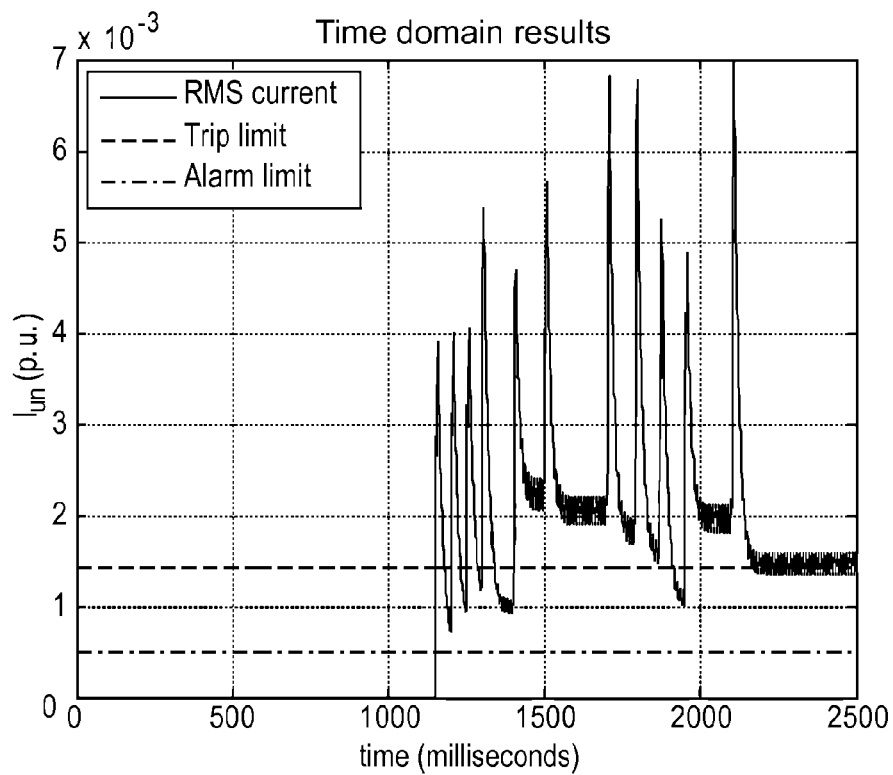
Figures 2C, 4:
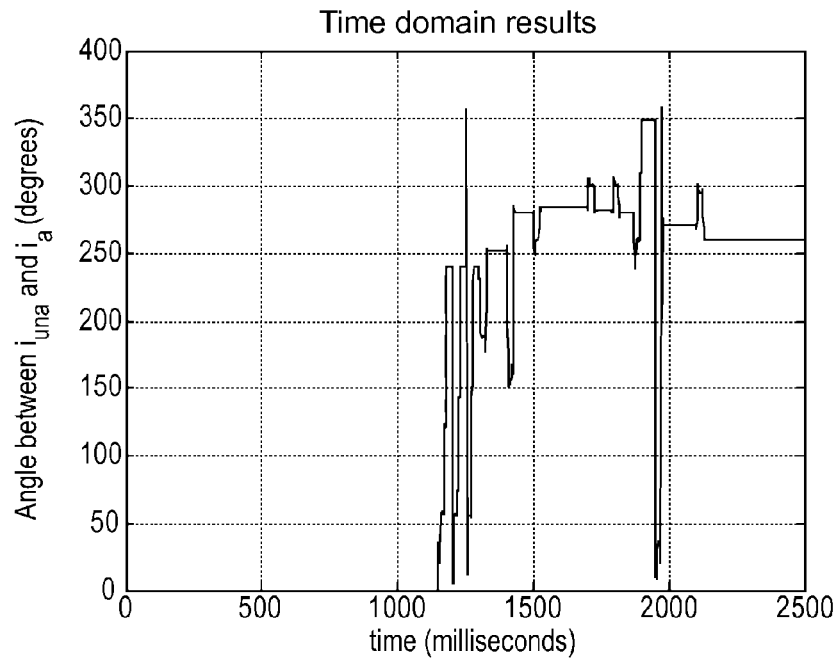
FIG. 4 shows an example of how information for each of instantaneous failure events is kept and recorded in a table for decision of sending an alarm or a trip signal.

With reference to FIG. 2a-c, the invention is further explained in an example, wherein the capacitor bank 2 has experienced 11 failure events, starting from the instant 1.15 second, the failure events are distinguished by 11 current peak occurrences as shown in FIGS. 2a and 2b. These peaks occurred during the arcing over the capacitor elements before their corresponding fusing links rupture. Each failure event is recognized by tracking the change in the unbalanced current measurements and detecting these current peaks, step 150.

The vectorial step change of the unbalanced current is calculated based on the difference between the present calculated per unit value of the unbalance current and the previous one. This calculation is vectorial, which means that it is based on complex form, in which both current magnitudes, i.e. RMS values and phase angles are taken into consideration. The magnitude and the phase angle of the vectorial step change are then determined, step 160. FIG. 2b illustrates the corresponding unbalanced current waveform in per unit of the phase current, while FIG. 2c shows the phase angles between the unbalanced current and the phase current corresponding to the failure events.

The determined phase angle is further normalized to be one of 0°, 60°, 120°, 180°, 240° and 300°, step 170, in order to detect which of the legs A1, B1, C1, A2, B2, C2 has experienced the failure event. In this arrangement, the normalized phase angle 0°, 60°, 120°, 180°, 240° or 300° is corresponding to leg A1, B1, C1, A2, B2 or C2.

Based on the vectorial step change of the unbalance current and the normalized phase angle of the unbalanced current, the number of internal failures and the location of each of these failures can be determined at step 200.

FIG. 5a illustrates the first scenario of a cancellation effect, wherein the operation of fuses or failure of elements in one leg may cancel the unbalanced current produced by another failure in another leg sharing the same phase but on the other side of the bank. An example is shown in the right side (b) of FIG. 5a. In this example, 3 fuse operations have occurred in one phase in the left Y section, meanwhile 2 fuse operations have occurred in the same phase but in right Y section within the same capacitor bank. This will result in an unbalanced current with the same magnitude and angle as the one obtained by having one fuse operation in the left Y of the same phase as shown in the left side (a) of FIG. 5a.

In general, element failures in the same phases but in different sides of the bank will lead to false detection on both the location and the number of failed elements. The detected location will be the location of the leg with the higher number of failed elements.

FIG. 5b illustrates the second scenario of the cancellation effect, wherein the operation of fuses in the three legs/phases within the same Y may result in no unbalanced signal detected. More precisely, this figure shows that a combination of fuse operation in all three legs of the same Y would result in either no or false unbalanced signal detected.

FIG. 5c illustrates a scenario of the over-accumulation effect, wherein failure of elements or operation of fuses in two legs/phases of one Y will be seen as a failure in the third phase of the other Y. This wrong detection gives an incorrect accumulation effect as if there is already failure in this third phase of the other Y. This over-accumulation effect may result in a false trip or alarm.

When there is a vectorial step change of the unbalanced current, the number of internal failures can be obtained based on a look-up table as exemplified in FIG. 7. The location of the internal failures can be identified by the normalized phase angle of the vectorial step change of the unbalanced current. Then, a total number of internal failures in each of legs/phases is updated accordingly, as shown in FIG. 4.

With the updated information of the internal failures, the protective unit can make decision by sending an alarm and/or a trip signal, at step 210 in FIG. 1.

Figure 3A:
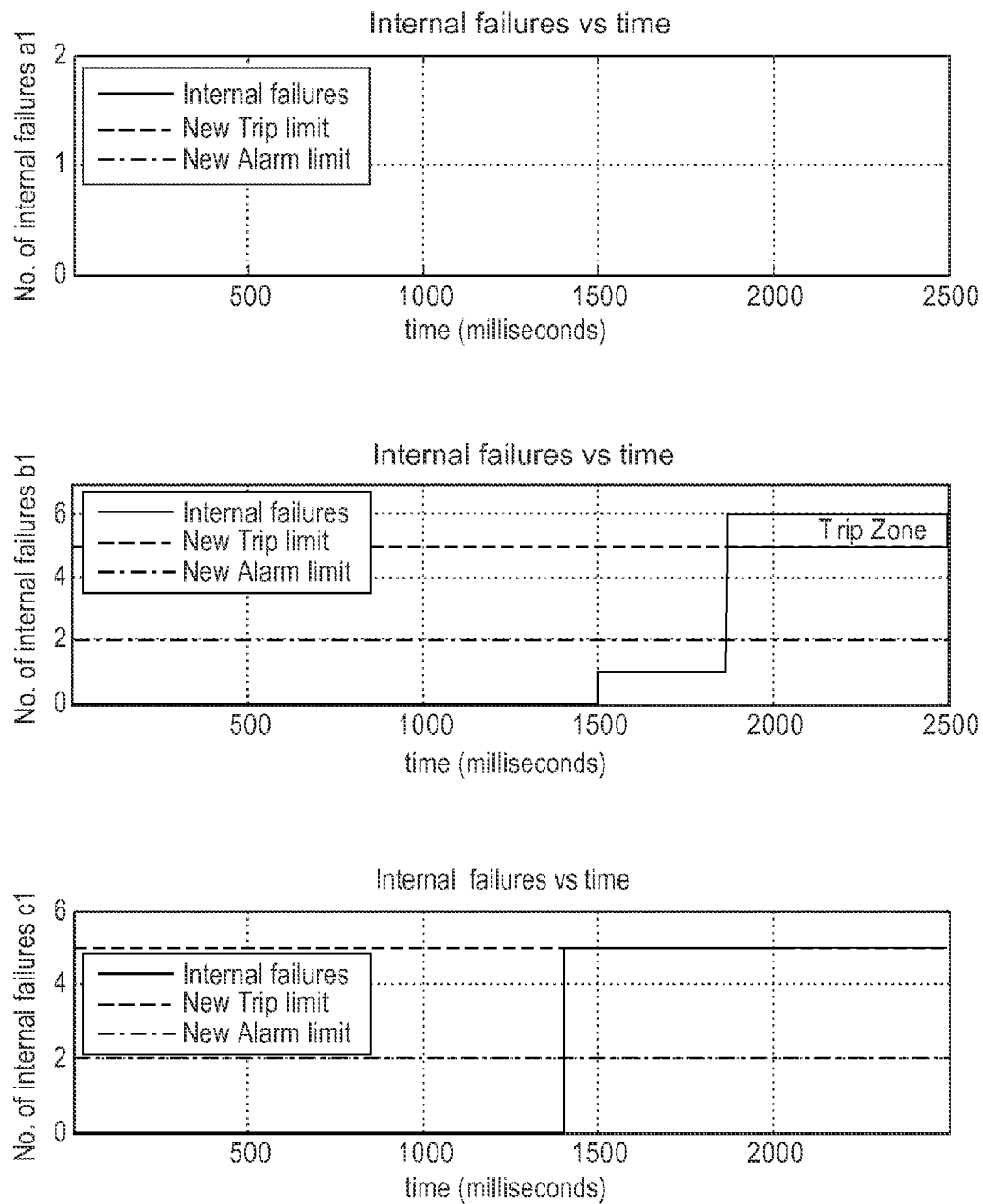
Figure 3B:
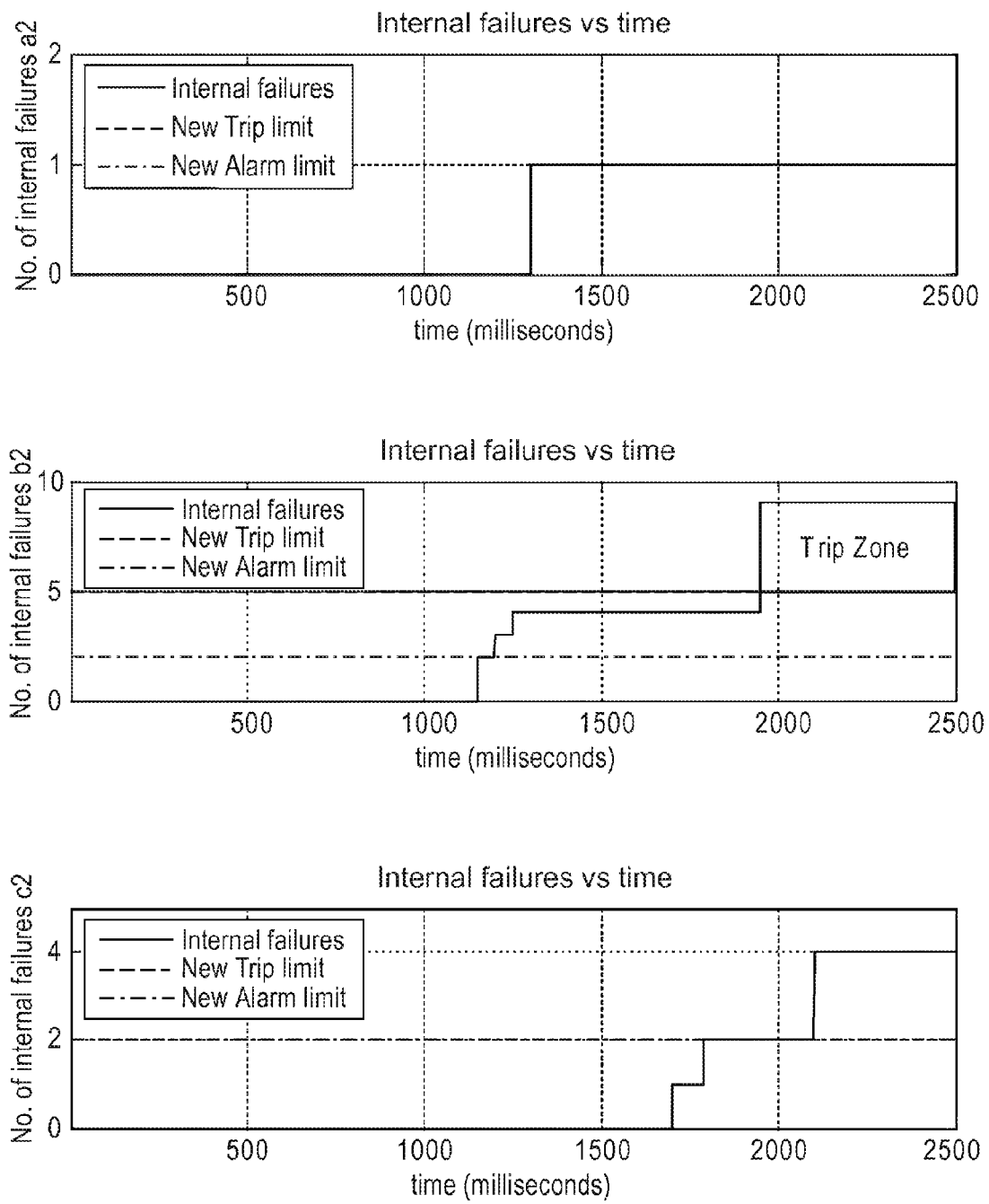

FIGS. 3a and 3b show the number of internal failures in each of the two Y sections corresponding to each of the instantaneous failure events, wherein new alarm and trip limits are introduced. The new limits are set based on the maximum allowable number of internal failures before having the voltage on the remaining healthy capacitors exceed the contingency overvoltage capability of these capacitors. In this example, the alarm limit is set after two internal failures and the trip signal is set after five internal failures.

As shown in this example, the problem with the existing unbalanced protection systems applied to the same case is the incorrect detection of the number of faulted elements that results in two main problems. Firstly, no trip signal is sent after exceeding the trip limit. This problem originates from the cancellation effect resulting from a combination of element failures in the same phase but in both Y sections. For example in FIG. 2b, Instant of a failure event number 9 at 1.87 second brings out this problem. After this failure event the number of element failures in B1 and in C1 is 6 and 5 respectively, while in B2 and in C2, it is 4 and 2 respectively. This is equivalent to having a current component equivalent to 2 element failures in B1 and 3 element failures in C1 which will cause a lower current than the trip limit, which was set for 5 element failures, and no trip signal will be sent.

The second problem is the false trip due to over-accumulation effect, which is introduced when internal failures occur in two different phases are then summed to the failures in the third phase of the opposite Y section and vice versa, Instant of a failure event number 5 at 1.40 second accentuates this problem. After this failure event, the number of element failures in C1 is 5 and in A2 and B2 is 1 and 4 respectively. This is equivalent to having a current component equivalent to 6 element failures in A2 and 9 element failures in B2 which results in an unbalanced current higher than the trip limit, which was set for 5 element failures, leading to sending a false trip signal.

These problems of the false tripping due to the over-accumulation effect and the cancellation effect caused by experiencing internal failures in different phases have been overcome by the present invention. Additionally, it gives a correct indication of the exact number of element failures and their corresponding locations.

What is claimed is:

1. A method for detecting a number of internal failures in a capacitor bank connected to a power system, wherein the capacitor bank comprises a plurality of capacitor units that are divided into two Y sections, each phase in each of the Y sections defining a leg, each leg including series and/or parallel-connected capacitor units, and each internal failure event may occur in one or more capacitor elements or units or involve one or more legs, the method comprises:
    measuring the phase current in one of the phases,
    calculating the Root Mean Square value, denoted by RMS, of the measured phase current,
    measuring the unbalanced current between the two sections,
    calculating the RMS value of the measured unbalanced currents, and
    detecting the phase angle between the measured phase current and the measured unbalanced current, characterized in that the method further comprises:

calculating the per unit value of the unbalanced current based on the calculated RMS value of the measured phase current and the calculated RMS value of the measured unbalanced current, recognizing each internal failure event by tracking the change in the unbalanced current, tracking and detecting a change of the unbalanced current between the present calculated per unit value of the unbalanced current and the previous calculated per unit value of the unbalanced current, determining the vectorial step change of the unbalanced current for each internal failure event, normalizing the phase angle of the determined vectorial step change of each internal failure event to be one of 0°, 60°, 120°, 180°, 240° and 300°, identifying the number of internal failures and their corresponding locations based on the determined vectorial step change of the unbalanced current and the normalized phase angle, and initiating an alarm or a trip signal when the determined total number of internal failures exceeds a first or a second threshold value respectively.

2. The method according to claim 1, wherein the method further comprises tracking the change of the unbalanced current and continuously comparing the change with a pre-defined threshold value in order to detect the internal failure.

3. The method according to claim 1, wherein the alarm signal is initiated when the number of internal failures in any of the legs exceeds the first threshold.

4. The method according to claim 1, wherein the trip signal is initiated when the number of internal failures in any of the legs exceeds the second threshold.

5. The method according to claim 1, wherein the first and second threshold values are corresponding to a lower and a higher limit of an allowable excessive voltage over the remaining healthy parts of the capacitor bank.

6. An arrangement for detecting a number of internal failures in a capacitor bank connected to a power system, wherein the capacitor bank comprises a plurality of capacitor units that are divided into two Y sections, each phase in each of the Y sections defining a leg, each leg including series and/or parallel-connected capacitor units, and each internal failure event may occur in one or more capacitor elements or units and involve one or more legs, the arrangement comprising, a first current transformer arranged to measure the phase current in one of the phases, a second current transformer is arranged at the neutral points of the two Y-sections for measuring an unbalanced current, a computing unit configured to calculate the Root Mean Square value, denoted by RMS, of the measured phase current, calculate the RMS value of the measured unbalanced current, calculating a per unit value of the unbalanced current based on the calculated RMS value of the measured phase current and the calculated RMS value of the measured unbalanced current, and calculate the phase angle between the measured phase current and the measured unbalanced current, and a protective unit configured to detect the phase angle between the measured phase current and its corresponding measured unbalanced current, characterized in that the protective unit is further configured to recognize each internal failure event by tracking the change in the unbalanced current track and detect a change of unbalanced current between the present calculated per unit value of the unbalanced current and the previous calculated per unit value of the unbalanced current, determine the vectorial step change of the unbalanced current for each internal failure event, normalize the phase angle of the determined vectorial step change of each internal failure event to be one of 0°, 60°, 120°, 180°, 240° and 300°, identify the number of internal failures and their corresponding locations based on the determined vectorial step change of the unbalanced current and the normalized phase angle, and initiate an alarm or a trip signal if the determined number of internal failures exceeds a first or a second threshold value.

7. The arrangement according to claim 6, wherein the protective unit is further configured to track the change of the unbalanced current and continuously compare the change with a pre-defined threshold value in order to detect the internal failure.

8. A computer program product for detecting a number of internal failures in a capacitor bank connected to a power system, wherein the capacitor bank comprises a plurality of capacitor units that are divided into two Y sections, each phase in each of the Y sections defining a leg, each leg including series and/or parallel-connected capacitor units, and each internal failure event may occur in one or more capacitor elements or units and involve one or more legs, wherein the computer program product is directly loadable into the internal memory of a computer, comprising software to perform the steps of, receiving measured phase currents, calculating the RMS values of the measured phase currents, receiving measured unbalanced currents between the two Y sections, calculating the RMS values of the measured unbalanced currents, calculating the phase angle between the measured phase current and the measured unbalanced current, calculating a per unit value of the unbalanced current based on the calculated RMS value of the measured phase current and the calculated RMS value of the measured unbalanced current, recognizing each internal failure event by tracking the change in the unbalanced current, tracking and detecting a change of the unbalanced current between the present calculated per unit value of the unbalanced current and the previous calculated per unit value of the unbalanced current, determining the vectorial step change of the unbalanced current for each internal failure event, normalizing the phase angle of the determined vectorial step change of each internal failure event to be one of 0°, 60°, 120°, 180°, 240° and 300°, determining the number of internal failures and their corresponding locations based on the determined vectorial step change of the unbalanced current and the normalized phase angle, and initiating an alarm or a trip signal when the determined total number of internal elements failures exceeds a first or a second threshold value.

9. A computer readable medium, having a program recorded thereon, where the program is to make a computer perform steps, when said program is run on the computer, for detecting a number of internal failures in a capacitor bank connected to a power system, wherein the capacitor bank comprises a plurality of capacitor units that are divided into two Y sections, each phase in each of the Y sections defining a leg, each leg including series and/or parallel-connected capacitor units, and each internal failure event may occur in one or more capacitor elements or units and involve one or more legs, comprising the steps of, receiving measured phase currents, calculating the RMS values of the measured phase currents, receiving measured unbalanced currents between the two Y sections, calculating the RMS values of the measured unbalanced currents, calculating the phase angle between the measured phase current and the measured unbalanced current, calculating a per unit value of the unbalanced current based on the calculated RMS value of the measured phase current and the calculated RMS value of the measured unbalanced current, recognizing each internal failure event by tracking the change in the unbalanced current, tracking and detecting a change of the unbalanced current between the present calculated per unit value of the unbalanced current and the previous calculated per unit value of the unbalanced current, determining the vectorial step change of the unbalanced current for each internal failure event, normalizing the phase angle of the determined vectorial step change of each internal failure event to be one of 0°, 60°, 120°, 180°, 240° and 300°, determining the number of internal failures and their corresponding locations based on the determined vectorial step change of the unbalanced current and the normalized phase angle, and initiating an alarm or a trip signal when the determined total number of internal elements failures exceeds a first or a second threshold value.

* * * * *